US007106221B2

(12) United States Patent
Horton et al.

(10) Patent No.: US 7,106,221 B2
(45) Date of Patent: Sep. 12, 2006

(54) CAPACITIVE TOUCH SWITCH SYSTEM FOR AN AUDIO DEVICE

(75) Inventors: Warren J. Horton, Newbury Park, CA (US); Bradley C. Wood, Canoga, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 490 days.

(21) Appl. No.: 10/427,392

(22) Filed: Apr. 30, 2003

(65) Prior Publication Data

US 2004/0217886 A1 Nov. 4, 2004

(51) Int. Cl.
H03K 17/94 (2006.01)
H03M 11/00 (2006.01)
G08B 5/22 (2006.01)

(52) U.S. Cl. .................... 341/33; 341/22; 340/815.62
(58) Field of Classification Search ................ 341/22, 341/33; 340/815.62; 307/119
See application file for complete search history.

(56) References Cited

U.S. PATENT DOCUMENTS

| 4,063,111 | A | | 12/1977 | Dobler et al. |
| 4,304,976 | A | | 12/1981 | Gottbrecht et al. |
| 4,561,002 | A | | 12/1985 | Chiu |
| 5,136,262 | A | * | 8/1992 | Spencer ........................ 331/135 |
| 5,148,126 | A | * | 9/1992 | Spencer ........................ 331/135 |
| 5,663,713 | A | * | 9/1997 | Ironside et al. ............. 340/661 |
| 5,886,428 | A | * | 3/1999 | Feiler et al. ................. 307/119 |
| 6,061,446 | A | * | 5/2000 | Lester et al. ........... 379/428.01 |
| 6,225,710 | B1 | | 5/2001 | Palata et al. |
| 2003/0076968 | A1 | * | 4/2003 | Rast ............................. 381/124 |

OTHER PUBLICATIONS

Sony Corporation, "Micro Hi-Fi Component System, Operating Instructions," No. 4-236-466-11(1), CMT-EX200, copyright date 2001 (24 pages).
Sony Corporation web site review at http://www.epinions.com/ Sony Electronics Inc Desktop Micro System CMT EX200 Complete Systems/ redir att ~1.

* cited by examiner

Primary Examiner—Jeffery Hofsass
Assistant Examiner—Sisay Yacob
(74) Attorney, Agent, or Firm—Brinks Hofer Gilson & Lione

(57) ABSTRACT

A capacitive touch switch system for use in an audio application includes a detecting circuit with a capacitive sensing device and a filtering circuit. The capacitive sensing device senses changes in capacitance. The filtering circuit filters external and/or internal interference that may affect the sensing of a capacitance change and/or the sound quality of an audio device. The capacitive touch switch system may be incorporated into a speaker and/or other components of the audio device. The capacitive touch switch system may control various audio parameters such as volume, bass, treble, balance, channel, and the like.

19 Claims, 8 Drawing Sheets

CAPACITIVE TOUCH SWITCH SYSTEM FOR AN AUDIO DEVICE

BACKGROUND OF THE INVENTION

1. Technical Field

The present invention relates to switch circuits. More particularly, the present invention relates to capacitive touch switch circuits in audio devices.

2. Related Art

Capacitive touch switches are an alternative to mechanical switches for providing user control inputs to various devices, including high voltage home appliances and lighting fixtures. With a capacitive touch switch, a user merely touches a capacitive area on the device to initiate a switching action, rather than moving a mechanical switch. Capacitive touch switches usually improve the ease of use of a device by users, especially those users who may have limited rotational movement or limited motor skills.

A capacitive touch switch generally utilizes a capacitive electric circuit that is responsive to the dielectric properties of a human body. A capacitor may be formed by disposing two metal plates in parallel with each other and separated by a distance D. Each plate has an area A. Thus, the capacitance of the capacitor may be calculated by the equation:

$$C = K \frac{8.85 \times 10^{-14} A}{D}, \qquad \text{(Eq. 1)}$$

where K represents the dielectric constant of the material between the plates, A represents the plate area in square centimeters and D represents the distance between the plates in centimeters.

The capacitance of a capacitor increases when a material that does not conduct electricity is disposed between the parallel metal plates. The ratio of the capacitance before and after the material is placed between the two plates is the dielectric constant K of the material. The dielectric constant of a vacuum $K_V$ is about 1 while the dielectric constant of distilled water $K_W$ is about 80. Thus, objects containing water, such as the human body, would increase the capacitance of the capacitor.

Because of the human body's dielectric properties, a capacitive touch switch may be activated by the touch of a finger or other body part on or near a capacitive touch area. An electronic circuit may be configured to operate by monitoring the capacitance change in the capacitive touch area. Thus, placing a human finger on or near the capacitive touch area forms an electrical interface that produces a measurable capacitance change.

However, the measured change in capacitance may be adversely affected by the environmental factors of the application for the capacitive touch switch. Factors that may affect the measured capacitance change when a human finger is on or near the capacitive touch area include the type of floor the human is standing on and the type of shoes he or she is wearing. The measured capacitance change may increase with bare concrete floors and thin-soled shoes. The measured capacitance change may decrease with carpeting and with thick-soled shoes. Furthermore, nearby metal shelves, tables, light fixtures and electrical wires also may vary the measured capacitance change caused by the human body. There also may be increased electromagnetic interference when increased capacitance is introduced into a particular environment from other sources such as lighting, electronic devices and the like. In many environments, at home, the office, or elsewhere, fluorescent lighting is a source of light. The 120 Hz signals generated by fluorescent and similar lighting may cause electromagnetic interference that may affect the operation of capacitive touch switches and may degrade the sound quality from an audio device.

Some applications that operate at lower voltages may be more sensitive to these environmental variations, especially electromagnetic interference. In applications such as audio devices and other devices for reproducing signals of higher quality, these environmental factors may interfere, alter, and/or degrade the signal quality of the measured capacitance change. Audio devices are systems and components that reproduce and/or assist in the reproduction of sound from electrical signals. Audio devices include sound reproduction equipment such as amplifiers, tuners, receivers, speakers, and the like. Audio devices also include systems and components that incorporate sound reproduction equipment such as personal computers, audiovisual devices and the like.

SUMMARY

This invention provides a capacitive touch switch system for an audio device. The capacitive touch switch system senses when the capacitance changes at a location and uses this capacitance change to control the auto device. The capacitance touch switch system also filters interference from environmental factors, which may affect sensing the change in capacitance and/or the sound quality of the audio device. The capacitive touch switch system changes or controls one or more audio parameters of the audio device in response to the change in capacitance. The location of the capacitive touch switch system could be in a speaker system, an amplification system, a tuning system, a personal computing system, a combination, and the like. The interference could be internal and/or external including one or more environmental factors such as 120 Hz signals from fluorescent lights.

The capacitive touch switch system may have a detecting circuit coupled to a transceiving circuit. The detecting circuit has a capacitive sensing device and a filter circuit. The capacitive sensing device senses a change in capacitance at a location. The filter circuit reduces interference from the capacitive sensing device. The transmitting circuit transmits an output signal in response to an input signal from the detecting circuit. The output signal controls at least one audio parameter.

The capacitive touch switch system may have an oscillating circuit, a detecting circuit, and a transceiving circuit. The oscillating circuit has two comparator circuits operable to generate a constant amplitude signal. The output of the first comparator circuit is electrically coupled to the input of the second comparator circuit. The detecting circuit is coupled to the oscillating circuit. The detecting circuit is operable to filter internal and external interference. The detecting circuit has a first conductive touch pad, a second conductive touch pad, a rectifier circuit coupled with the first and second touch pads, a voltage doubler circuit coupled with the rectifier circuit, and a high-pass filter. The transceiving circuit is coupled to the detecting circuit. The transceiving circuit is operable to convert the constant amplitude signal into a logic signal. The transceiving circuit has one or more comparator circuits, a feed back circuit coupled with the comparator circuits, and a voltage divider coupled with the comparator circuits.

In a method for controlling one or more audio parameters of an audio device with a capacitive touch switch system, a constant amplitude signal is generated and attenuated. The attenuated constant amplitude signal is filtered. The level of attenuation of the constant amplitude signal is detected. The constant amplitude signal is converted into a logic signal. The logic signal is decoded.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
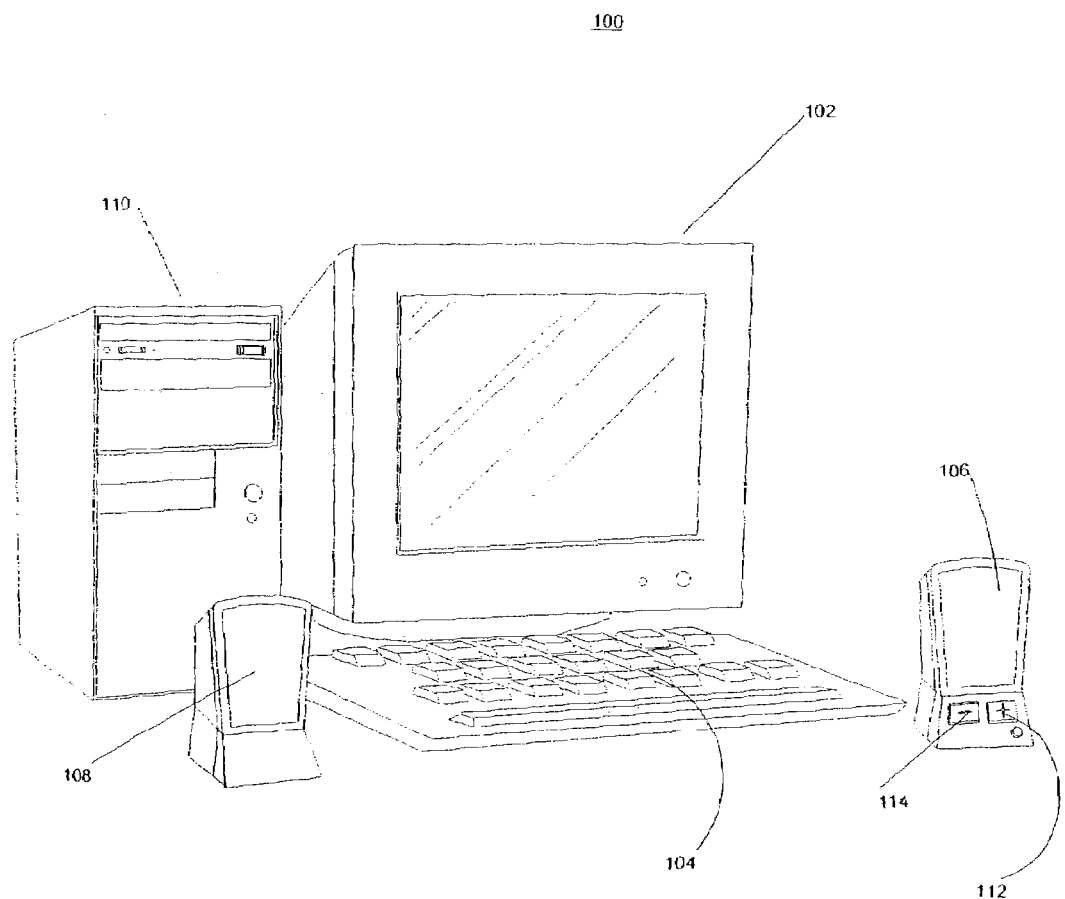
FIG. 1 is a perspective view of an exemplary personal computer with a touch switch system.

FIG. 1 depicts a perspective view of a personal computer 100 with a capacitive touch switch system. The personal computer 100 includes a monitor 102, a keyboard 104, a first speaker 106, a second speaker 108, and a CPU 110. Additional speakers may be used. The capacitive touch switch system may be used to vary or control the audio sound level or other audio parameters of the personal computer 100. The capacitive touch switch system includes a first conductive touch pad 112, a second conductive touch pad 114, and a microprocessor circuit or other control circuit. The conductive touch pads 112 and 114 are disposed on the surface of the second speaker 108. The first conductive touch pad 112 and a second conductive touch pad 114 are coupled to the microprocessor circuit, which may be disposed in the CPU 110, the monitor 102, the second speaker 108, and/or other components of the personal computer 100. The microprocessor circuit may have a detecting circuit, an oscillating circuit, a transceiving circuit, and/or other components. "Coupled" includes directly connected or indirectly connected through one or more intermediate components. Coupled also includes electrical, magnetic, or radio connections or a combinations thereof. The first conductive touch pad 112 and the second conductive touch pad 114 may be disposed on only one of the speakers 106 and 108 or may be disposed on both speakers 106 and 108. The conductive touch pads 112 and 114 may be disposed on other components of the personal computer 100. There may be only one touch pad or more than two touch pads. The personal computer 100 may have other configurations including those with fewer or additional components.

In operation, a user may introduce a first capacitance to the first conductive touch pad 112 by contacting the first conductive touch pad 112 with a finger or other body part. The volume increases on both the speakers 106 and 108 in response to the first capacitance. Conversely, a user may introduce a second capacitance to the second conductive touch pad 114 by contacting the second conductive touch pad 114 with a finger or other body part. The volume decreases on both the speakers 106 and 108 in response to the second capacitance. Additionally, a user may introduce simultaneous capacitances to both the first conductive touch pad 112 and the second conductive touch pad 114. The volume on speakers 106 and 108 is mute in response to the simultaneous capacitances. Simultaneous capacitances include capacitances applied at the same time, applied at substantially the same time, or applied within a specified time period.

The first conductive touch pad 112 and the second conductive touch pad 114 also may be used to vary or control other audio parameters such as the treble, bass, other audio output characteristics influential in the shaping of sound, control signals, the like, and combinations. Control signals include any signal affecting operation of the audio device in the personal computer such as power, radio station selection, operation mode, and the like. This control may be accomplished by adding additional conductive touch pads or enabling a user to contact the first conductive touch pad 112 and the second conductive touch pad 114 simultaneously and/or in specified sequences to "select" which characteristic to control. A user may simultaneously touch both conductive touch pads twice in quick succession to select the treble control and then proceed to increase or decrease the treble level with other touches to the conductive touch pads. The touch pad 112 and 114 may be used with a visual display on the monitor 102, an audio output through the speakers 106 and 108, and/or another output from the personal computer 100 indicating the changes or operation using the touch pad(s).

In addition to personal computers, the capacitive touch switch system may be used in any audio device. The capacitive touch switch system may be used in various environments including home, office, automotive, and similar locations.

Figure 2:
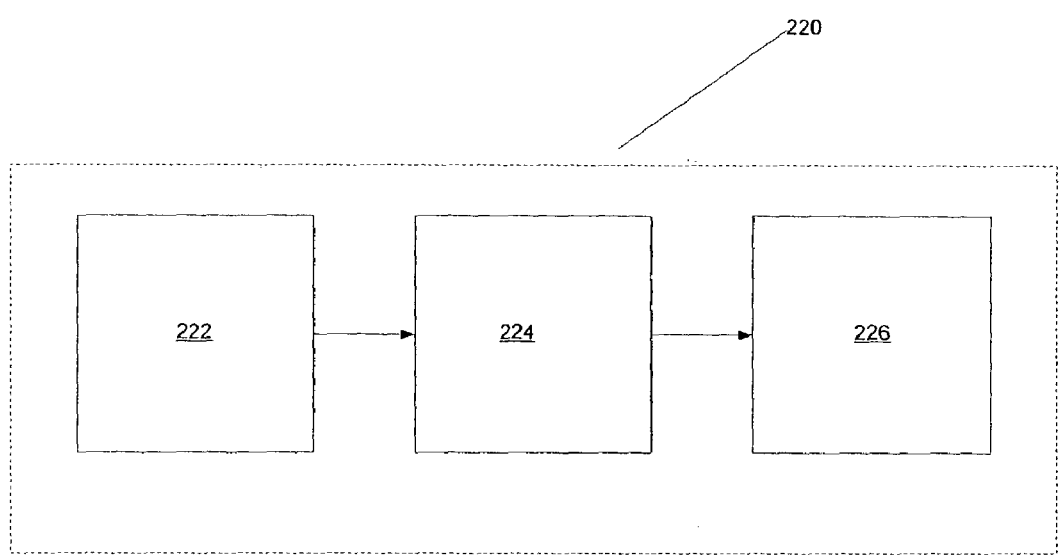
FIG. 2 is a block diagram or flow chart of a touch switch system.

FIG. 2 is a block diagram or flowchart of a capacitive touch switch system 220. The capacitive touch switch system 220 includes an oscillating circuit 222, a detecting circuit 224, and a transceiving circuit 226. The detecting circuit 224 is coupled with the oscillating circuit 222. The transceiving circuit 226 also is coupled with the detecting circuit 224. Generally, the oscillating circuit 222 operates to generate a constant current that enables the capacitive touch switch system 220 to have a constant power supply. The detecting circuit 224 operates to determine whether and how the capacitive touch switch system has been activated. The detecting circuit 224 senses a change in capacitance at a selected location. "Senses" includes measuring and/or detecting the change in capacitance. The detecting circuit 224 also filters interference from a capacitive sensing device. The interference may affect operation of the capacitive touch switch system 220 and may affect or degrade the sound quality of an audio device. This interference may be external from an environmental factor such as fluorescent lighting. This interference may be internal to the personal computer or audio device. The transceiving circuit 226 receives an input signal from the detecting circuit 224 and transmits an output signal to a controller in an audio device. The output signal is responsive to the input signal and changes or controls one or more audio parameters such as volume, treble, bass, balance, and the like.

Figure 3:
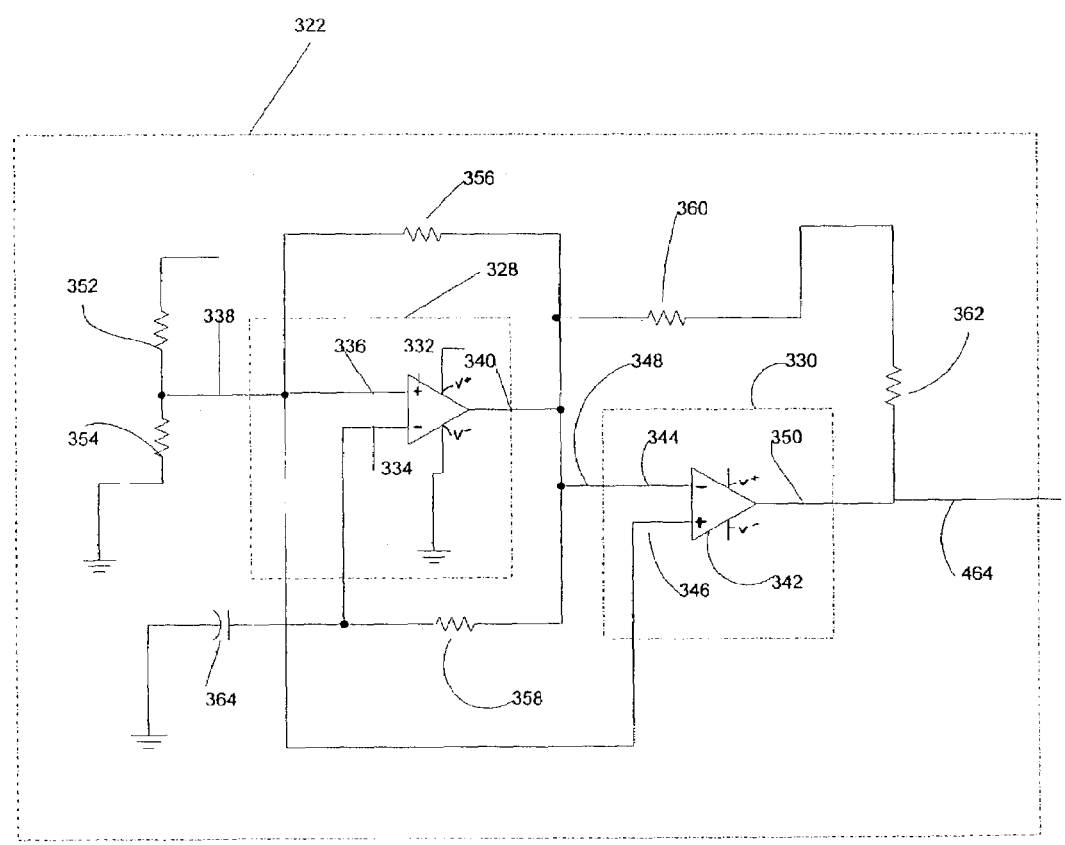
FIG. 3 is a schematic diagram of an oscillating system for a touch switch system.

FIG. 3 is a schematic diagram of an oscillating circuit 322 for a capacitive touch switch system. The oscillating circuit 322 includes a first comparator circuit 328 and a second comparator circuit 330. The first comparator circuit 328 and the second comparator circuit 330 each may be an LM239 integrated circuit from National Semiconductor of Santa Clara, Calif. or a similar integrated circuit. The oscillating circuit 322, the first comparator circuit 328, or the second comparator circuit 330 may be implemented using operational amplifiers.

The first comparator circuit 328 has an operational amplifier 332 with a non-inverting input 334 and an inverting input 336 as well as high and low reference voltages labeled respectively as V$^+$ and V$^-$. The operational amplifier 332 may be configured to amplify an input signal 338 relative to the reference voltages V$^+$ and V$^-$ thus driving an output signal 340 to be either "on" or "off," neglecting any transient changing times between the "on" and "off" state.

The second comparator circuit 330 has an operational amplifier 342 with a non-inverting input 344 and an inverting input 346 as well as high and low reference voltages labeled respectively as V$^+$ and V$^-$. The operational amplifier 342 may be configured to amplify an input signal 348 relative to the reference voltages V$^+$ and V$^-$ thus driving an output signal 350 to be either "on" or "off," neglecting any transient changing times between the "on" and "off" state.

The first comparator circuit 328 and the second comparator circuit 330 may be electrically coupled to run opposite each other. This is accomplished by coupling the output 340 of the first comparator circuit 328 to the input 348 of the second comparator circuit 330. Such a configuration is advantageous when the two comparators run opposite each other, as the current flowing through the circuit remains constant. The constant current results because either of the first comparator circuit 328 or the second comparator circuit 330 will be "on" and thus current spikes from an oscillation are reduced or eliminated.

The first comparator circuit 328 and the second comparator circuit 330 additionally may include resistive elements 352, 354, 356, 358, 360 and 362. The resistive elements 352, 354, 356, 358, 360 and 362 may be adjusted at either the manufacturing level or the end-user level depending on the desired sensitivity of the circuit and the frequency level the oscillating circuit 322 is configured to generate. The resistive elements 360 and 362 act as "pull up" resistors. A capacitor 364 also may be included in the oscillating circuit 322 and may act with the resistive element 358 to determine the frequency of the oscillating circuit 322. Capacitor 364 and resistive element 358 can determine the charge/discharge timing of the inverting input voltage 336 or 346 for the first comparator circuit 328 and/or second comparator circuit 330 respectively. Resistive elements 352, 354, and 356 also can affect the frequency of the oscillating circuit 322 by determining the voltage swing required in the oscillating circuit 322. The oscillating circuit 322 may generate a square wave frequency on the order of 150 kHz.

The oscillating circuit 322 may include a single comparator circuit or more than two comparator circuits. Other oscillating circuits may be used.

Figure 4:
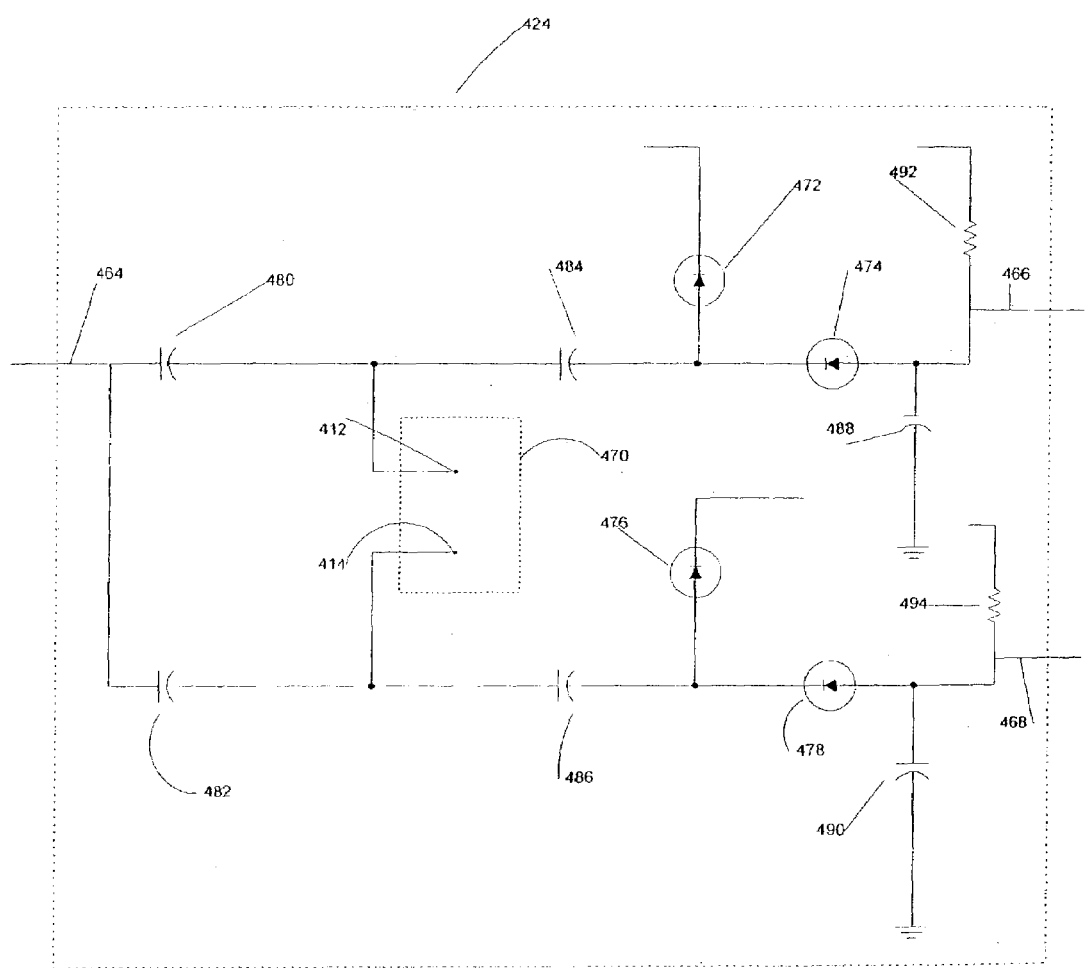
FIG. 4 is a schematic diagram of a detecting system for a touch switch system.

FIG. 4 is a schematic diagram of a detecting circuit 424 for a capacitive touch switch system. The detecting circuit 424 has an input 464 as well as a first output 466 and a second output 468. The detecting circuit 424 also includes a capacitive sensing device 470 for determining the control level of one or more of the audio or operation parameters of an audio device. The audio and operation parameters include volume, treble, bass, balance, and the like. The capacitive sensing device 470 can be any electrical mechanism and/or circuit that measures or senses a change in the capacitance at a location. The changes in capacitance could be single or multiple changes in one or multiple locations. The specified location could be on the surface or internal to the audio device. The specified location may be a smaller area for one or few changes. The specified location may be larger for multiple or sequential changes responsive to the area. The capacitive sensing device 470 may include one or more capacitive touch switches such as the conductive touch pads 412 and 414. The capacitive touch switches may be separate capacitive touch areas and may be on one or more surfaces of the audio device. The capacitive sensing device 470 may be configured as a continuous area rather than separate capacitive touch areas.

The detecting circuit 424 may include a rectifier circuit. The rectifier circuit has diodes 472 and 474 electrically coupled with each other. Additionally, another rectifier circuit may include diodes 476 and 478. The detecting circuit 424 also may include capacitors 480, 482, 484, 486, 488 and 490 as well as resistive elements 492 and 494. The capacitors 480, 482, 484, 486, 488 and 490 as well as resistive elements 492 and 494 may be adjusted depending on the desired sensitivity of the circuit.

The detecting circuit 424 is coupled with the oscillating circuit 422 such that the detecting circuit 424 can accept a signal from the oscillating circuit 422. The detecting circuit 424 attenuates the signal generated from the oscillating circuit 422 and accepts current flowing from the oscillating circuit 422. This attenuation may be accomplished through use of the capacitors 480 and 482 which may act to shape the square-wave signal coming from the oscillating circuit 422 into an AC balanced wave. The current flowing from the oscillating circuit 422 enters the detecting circuit 424 through the input 464. Moreover, current from the detecting system may exit through the first output 466 and/or the second output 468 and proceed to the transceiving system 426.

The detecting circuit 424 has a filter circuit to reduce or eliminate interference with sensing or measuring the capacitance change at the location of the capacitive sensing device 470. The interference may be external from environmental factors such as fluorescent lighting. The interference may be internal for the audio device. The filter circuit includes the capacitor 484 coupled with resistive element 492. This configuration acts as a single-pole, high-pass filter, enabling the detecting circuit 424 to filter out 120 Hz signals from the surrounding environment. Another single-pole, high-pass filter may be included and represented by capacitor 486 coupled with resistive element 494. Other filtering systems may be used.

The single-pole, high-pass filter element values may be optimized to filter 120 Hz signals while still allowing the signal from the oscillating circuit 422 through the detecting circuit 424. This may be accomplished by selecting time constants for the single-pole, high-pass filter. Using the single-pole high pass filter that includes capacitor 484 and resistive element 492, the time constant may be derived from the equation:

$$\tau = 2\pi RC \tag{Eq. 2}$$

The detecting system 424 may further include diodes 472 and 474 electrically coupled with each other as well as a capacitor 488. This configuration may act as a voltage doubler circuit to increase the voltage that was lost through the various elements of the touch switch circuit 420. A voltage doubler circuit including diodes 496 and 498 coupled with each other as well as capacitor 490 may be implemented. Other filtering and voltage doubling circuits may be used.

Figure 5:
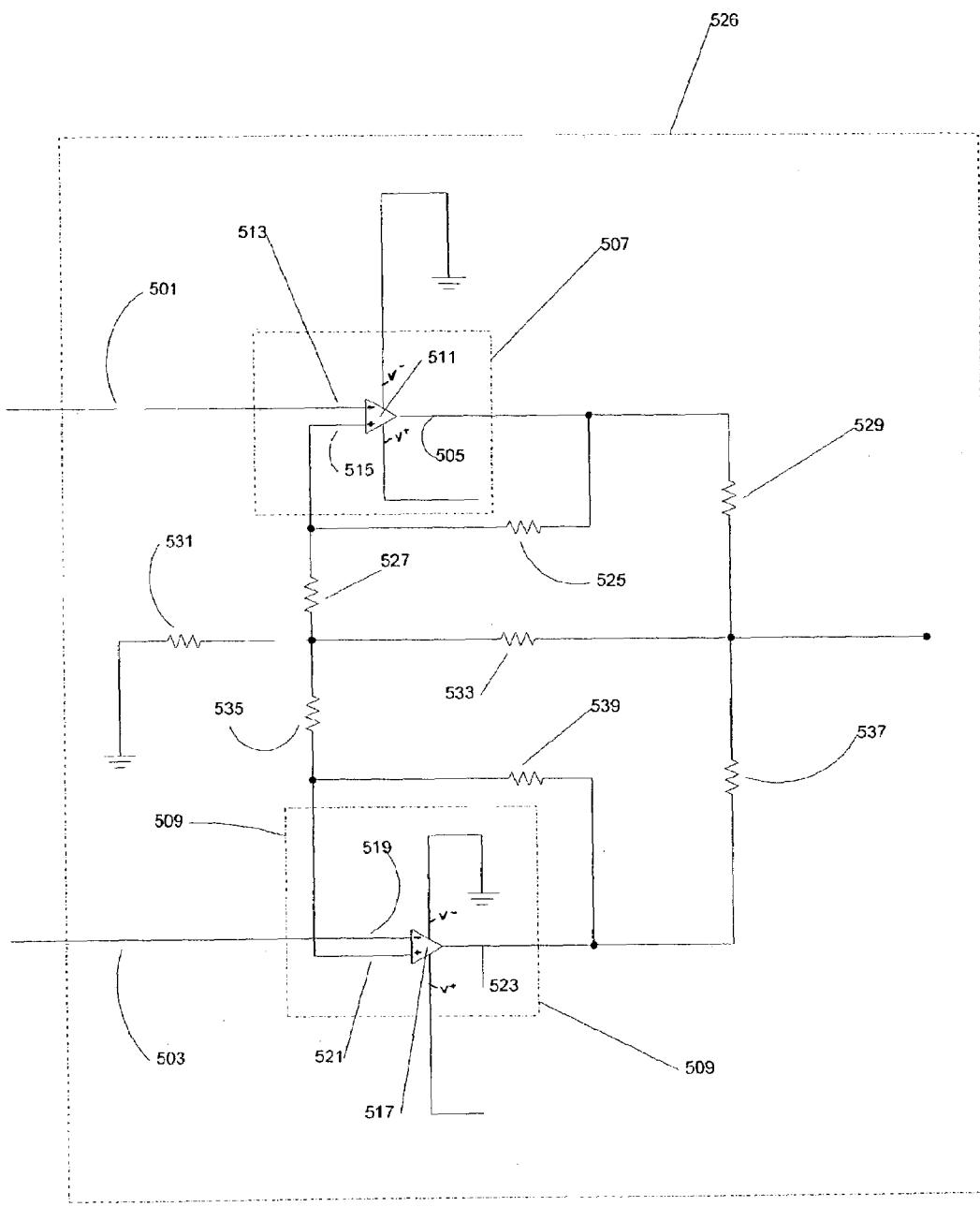
FIG. 5 is a schematic diagram of a transceiving system for a touch switch system.

FIG. 5 is a schematic diagram of the transceiving circuit 526. The transceiving system 526 may include a first input 501 and a second input 503 as well as an output signal 505. The tranceiving circuit 526 provides an output signal to a controller in the audio device in response to the input signals from the detecting system 424. The controller adjusts or modifies one or more audio or operations parameters of the audio device in response to the output signal. The transceiving system 526 may also include a third comparator circuit 507 and a fourth comparator circuit 509. The third comparator circuit 507 and the fourth comparator circuit 509 each may be the LM239 integrated circuit from National Semiconductor of Santa Clara, Calif. or similar integrated circuits. The transceiving system 526, the third comparator circuit 507, and/or the fourth comparator circuit 509 may be implemented using operational amplifiers.

The third comparator circuit 507 includes an operational amplifier 511 that includes a non-inverting input 513 and an inverting input 515 as well as High and Low reference voltages labeled respectively as V$^+$ and V$^-$. The operational amplifier 511 may be configured to amplify the first input signal 501 relative to the reference voltages V$^+$ and V$^-$ thus driving an output signal 505 to be either "on" or "off," neglecting any transient changing times between the "on" and "off" state.

The fourth comparator circuit 509 includes an operational amplifier 517 that includes a non-inverting input 519 and an inverting input 521 as well as High and Low reference voltages labeled respectively as V$^+$ and V$^-$. The operational amplifier 517 may be configured to amplify the second input signal 503 relative to the reference voltages V$^+$ and V$^-$ thus driving a second output signal 523 to be either "on" or "off," neglecting any transient changing times between the "on" and "off" state.

The third comparator circuit 507 and the fourth comparator circuit 509 also may include resistive elements 525, 527, 529, 531, 533, 535, 537 and 539. The resistive elements 525, 527, 529, 531, 533, 535, 537 and 539 may be adjusted depending on the desired sensitivity of the circuit.

Resistive elements 525 and 527 add hysteresis to the third comparator circuit 507. Particularly, resistive element 525 may act to provide a small amount of positive feedback to the third comparator circuit 507. The reference voltage across the non-inverting input 513 fluctuates slightly depending on the voltage across the output 505. While the third comparator circuit 507 may operate very quickly, the capacitor 588 discharges relatively slowly, which presents the opportunity for the third comparator circuit 507 to turn "on" and "off" in quick succession, neglecting any transient changing times between the "on" and "off" state. This phenomenon produces noise within the third comparator circuit 507 that may be reduced by providing resistive element 525.

Likewise, resistive elements 535 and 539 add hysteresis to the fourth comparator circuit 509. Particularly, resistive element 539 may act to provide a small amount of positive feedback to the fourth comparator circuit 509. The reference voltage across the non-inverting input 519 fluctuates slightly depending on the voltage at the output 523. While the fourth comparator circuit 509 may operate very quickly, the capacitor 590 discharges relatively slowly, which presents the opportunity for the fourth comparator circuit 509 to turn "on" and "off" in quick succession, neglecting any transient changing times between the "on" and "off" state. This phenomenon produces noise within the fourth comparator circuit 509 that may be reduced by providing resistive element 539.

The transceiving system 526 also includes a voltage divider circuit represented by resistive elements 531 and 533. Because the third comparator circuit 507 and the fourth comparator circuit 509 may be configured to operate independently of each other, the resistive element 527 of the third comparator circuit 507 and resistive element 535 of the fourth comparator circuit 509 may act to isolate the voltage divider such that each comparator circuit has its own hysteresis circuit.

Additionally, the transceiving system 526 may include resistive elements 529 and 537. Because the voltage at the output of transceiving system 526 may be held constant by an operation decoder (not shown), resistive elements 529 and 537 act to limit the current so that a specified current depending on the combined state of comparator circuit 507 and comparator circuit 509 may exit the transceiving system 526.

Figure 6:
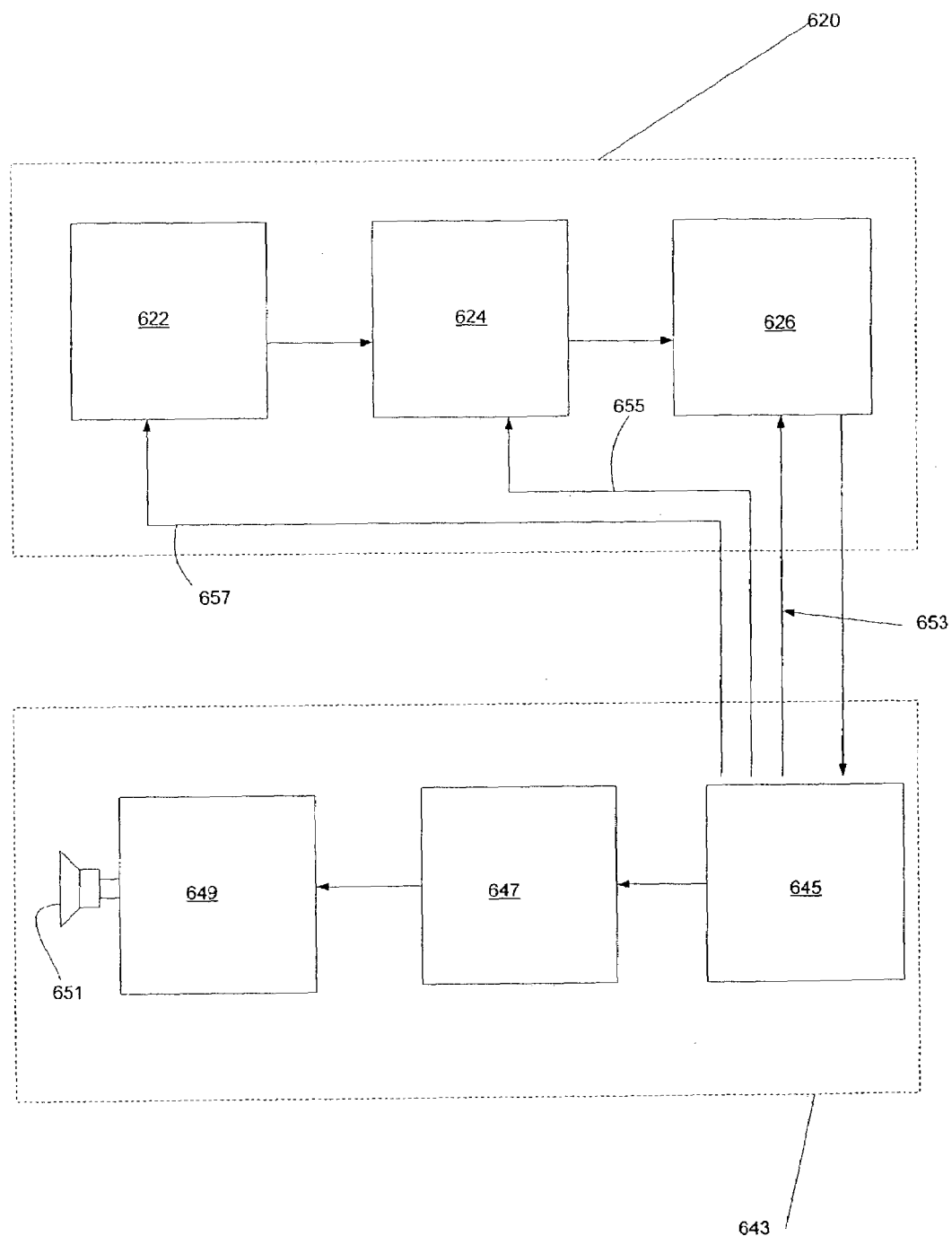
FIG. 6 is a block diagram or flow chart of an audio device with a touch switch system.

FIG. 6 is a block diagram or flow chart of an audio device 643 with a capacitive touch switch system 620. The capacitive touch switch system 620 has an oscillating circuit 622, a detecting circuit 624, and a transceiving circuit 626, which may be the same or similar to circuits 222, 224, 226, other circuits, or a combination of such circuits. The capacitive touch switch system 620 may have other configurations including those with fewer or additional components. The audio device 643 has a logic decoder 645, a preamp 647, a power amp 649 or a speaker 651. The audio device may include other or additional equipment suitable for use in audiovisual environments. The logic decoder 645 may process and variably attenuate the signals flowing from the touch switch circuit 620. The logic decoder 645 also may decode the current drawn from the system into discrete states that are then processed to determine volume increase, decrease, or mute, or other audio characteristics. The logic decoder 645 also may provide power to each of the oscillating circuit 622, the detecting circuit 624 and the transceiving system 626, as represented by power lines 653, 655 and 657 respectively. Once the logic decoder 645 processes a signal, it is configured to communicate with the preamp 647, the power amp 649, and the speaker 651. The signal from the capacitive touch switch system 620 may bypass the logic decoder 645 and proceed straight to the preamp 647, the power amp 649, and/or the speaker 651. The signal from the capacitive touch switch system 620 may bypass the transceiving circuit 626 and proceed directly to the logic decoder 645 and/or to the preamp 647.

Figure 7:
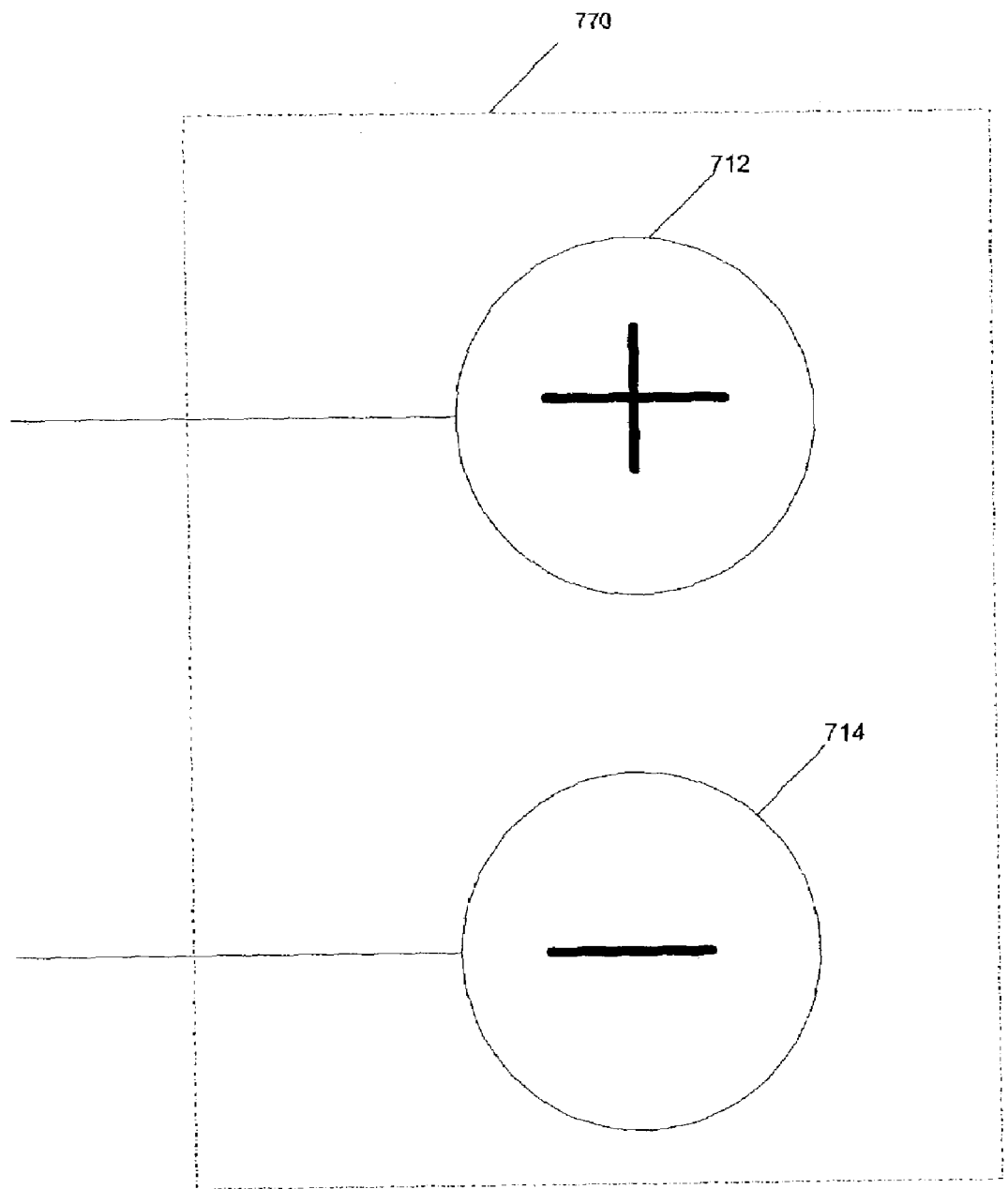
FIG. 7 is an exemplary touch pad display of a touch switch system.

FIG. 7 is a block diagram of a capacitive sensing device 770 including a first conductive touch pad 712 and a second conductive touch pad 714. The conductive touch pads 712 and 714 may be the same as conductive touch pads 112 and 114 or other conductive touch pads. The first conductive touch pad 712 and the second conductive touch pad 714 may be each about 1 cm in diameter and spaced apart from each other. Adjustments may be made to the size of the touch switch 720 depending on the particular application. Larger or similar diameter touch pads may be used.

The capacitive sensing device 770 is configured to sense or measure the change in capacitance for a capacitive touch switch system 720. A user touches the first touch pad 712 and the capacitance increase associated with the user's touch causes the signal from an oscillating circuit in the capacitive touch switch system to be attenuated by a capacitor. A resistive element may operate to charge the capacitor. Similarly, when a user touches the second touch pad 712, the resistive element may work to charge an additional capacitor.

Figure 8:
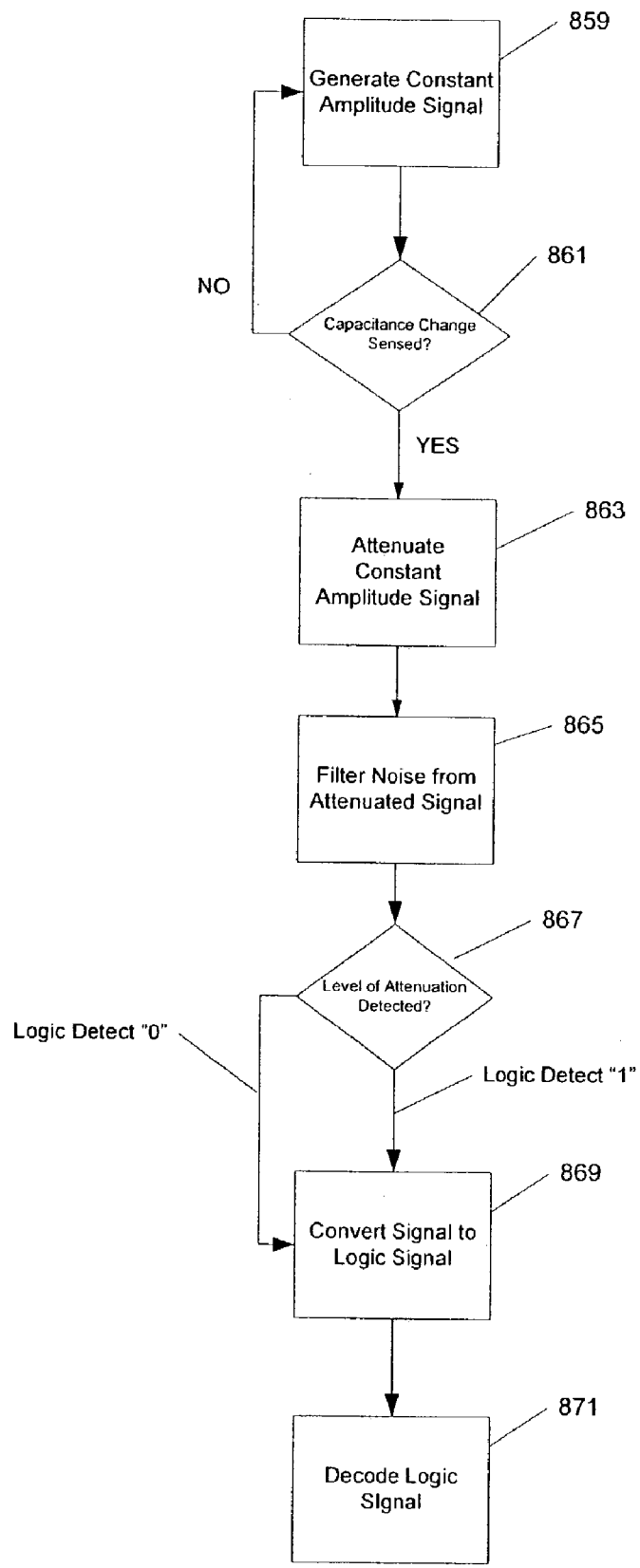
FIG. 8 is a flow chart of a method for controlling audio output characteristics using a capacitive touch system.

FIG. 8 is a flow chart of a method for controlling an audio device using a capacitive touch switch system. A constant amplitude signal is generated 859. An oscillator may generate the constant amplitude signal as previously discussed. The oscillator may have a first comparator circuit and/or a second comparator circuit. Other oscillators may be used such as a signal generator, a microcontroller, or a crystal oscillator, and the like. The constant amplitude signal may be a square wave. The constant amplitude signal may be generated by external signals such as radio signals or signals generated from power lines, and the like. A capacitance change is sensed 861. A capacitive sensing device may sense the change in capacitance as previously discussed. A pair of capacitors may be coupled with first touch pad and/or second touch pad. The constant amplitude signal is attenuated 863 in response to the change in capacitance.

The attenuated signal is filtered 865 to remove or reduce noise. A filter may be used to attenuate the signal. A noise filter may have a capacitor electrically coupled with a resistive element as previously discussed. A single-pole high-pass filter may be used to filter signals from the surrounding environment such as 120 Hz signals from fluorescent lighting or other electrical devices. Another single-pole high-pass filter may be included to provide further filtering. Either or both of the single-pole high pass filters may filter the device. Other filters may be used including those to filter internal interference for an audio device. The noise may be internal or external interference as previously discussed.

The level of attenuation in the signal is detected 867. The signal is converted 869 into a logic signal in response to the level of attenuation. The logic level signal may be used by other electronic sub-systems. A detector may be used that has diodes configured to rectify the oscillator signal. This rectified signal then may be compared to a threshold voltage to detect the level of attenuation. When the detected DC voltage value of the rectified signal crosses the threshold voltage, the logic state output of the detector is changed. If a capacitive sensing device is contacted, the logic may be a "0" value. While if the capacitive sensing device is not contacted, the logic may be "1" value. Whether the signal is logic detect "1" or a logic detect "0," the signal proceeds to a signal converter or similar device. The signal converter converts the two logic signals into an analog variable state current signal. The signal converter may be a transceiving circuit as discussed previously.

The analog variable state current signal is decoded 871. An operation decoder may be used to decode the analog variable state current signal. Upon decoding, the decoded signal may be used to control one or more auto parameters in an audio device as previously discussed.

The capacitive touch switch system may be incorporated into applications that generally do not respond well to such an implementation. A filtering circuit minimizes the effects of electromagnetic interference generated by various external and internal environmental factors. The capacitive touch switch system does not require moving parts, thus increasing both durability and performance of the device. In addition, the conductive touch areas utilized in the capacitive switch may have a small surface area. The smaller the surface area, the less capacitance is introduced to the system when a user contacts the conductive area. Furthermore, smaller capacitive switches may lend an increased aesthetic appeal if the disclosed system is incorporated into commercial products.

While various embodiments of the invention have been described, it will be apparent to those of ordinary skill in the art that other embodiments and implementations are possible within the scope of the invention. Accordingly, the invention is not to be restricted except in light of the attached claims and their equivalents.

What is claimed is:

1. A capacitive touch switch system for an audio device, comprising:
    a detecting circuit having a first conductive touch pad, a second conductive touch pad, a rectifier circuit coupled with the first conductive touch pad and the second conductive touch pad, a voltage doubler circuit coupled with the rectifier circuit, a single-pole high pass filter, a capacitive sensing device and a filter circuit, where the capacitive sensing device senses a change in capacitance at a location, where the filter circuit reduces interference from the capacitive sensing device; and
    a transceiving circuit coupled to the detecting circuit, where the transceiving circuit transmits an output signal in response to an input signal from the detecting circuit, where the output signal controls at least one audio parameter.

2. The capacitive touch switch system of claim 1, where the interference affects sensing the change of capacitance.

3. The capacitive touch switch system of claim 1, where the interference affects sound quality.

4. The capacitive touch switch system of claim 1, where the interference is from fluorescent lighting.

5. The capacitive touch switch system of claim 1, where the interference is from a 120 Hz signal.

6. The capacitive touch switch system of claim 1, further comprising an oscillating circuit coupled to the detection circuit, where the detecting circuit is operable to attenuate a constant amplitude signal from the oscillating circuit.

7. The capacitive touch switch system of claim 6, where the oscillating circuit comprises two comparator circuits oppositely connected to each other.

8. The capacitive touch switch system of claim 7, where the oscillating circuit comprises resistive elements for controlling the feedback of the comparator circuits.

9. The capacitive touch switch system of claim 6, where the oscillating circuit generates a signal of approximately 150 kHz.

10. The capacitive touch switch system of claim 6, where the filter circuit comprises at least one filter to reduce interference with the constant amplitude signal.

11. The capacitive touch switch system of claim 1, where the single-pole high pass filter is optimized to filter 120 Hz signals.

12. The capacitive touch system of claim 1, where the transceiving system comprises:
    at least one comparator circuit;
    a feedback circuit coupled with the at least one comparator circuit; and
    a voltage divider coupled with the at least one comparator circuit.

13. A capacitive touch switch system for an audio device, comprising:
- an oscillating circuit having two comparator circuits operable to generate a constant amplitude signal, where the output of the first comparator circuit is electrically coupled to the input of the second comparator circuit;
- a detecting circuit coupled to the oscillating circuit, the detecting circuit operable to filter internal and external interference, the detecting circuit having a first conductive touch pad, a second conductive touch pad, a rectifier circuit coupled with the first conductive touch pad and the second conductive touch pad, a voltage doubler circuit coupled with the rectifier circuit, and a high-pass filter;
- a transceiving circuit coupled to the detecting circuit, the transceiving circuit operable to convert the constant amplitude signal into a logic signal, the transceiving circuit having at least one comparator circuit, a feedback circuit coupled with the at least one comparator circuit, and a voltage divider coupled with the at least one comparator circuit.

14. The capacitive touch switch system of claim 13 where the oscillating circuit generates a signal of approximately 150 kHz.

15. The capacitive touch switch system of claim 13 where the oscillating circuit further comprises resistive elements for controlling feedback of the comparator circuits.

16. The capacitive touch switch system of claim 13 where the high-pass filter of the detecting circuit is optimized to filter 120 Hz signals.

17. The capacitive touch switch system of claim 13 where the detecting circuit is operable to attenuate the constant amplitude signal generated by the oscillating circuit.

18. A capacitive touch switch system for an audio device, comprising:
- a detecting circuit having a capacitive sensing device and a filter circuit, where the capacitive sensing device senses a change in capacitance at a location, where the filter circuit reduces interference from the capacitive sensing device, the detecting circuit further comprising a rectifier circuit coupled with the capacitive sensing device, a voltage doubler circuit coupled with the rectifier circuit, a single-pole high pass filter; and
- a transceiving circuit coupled to the detecting circuit, where the transceiving circuit transmits an output signal in response to an input signal from the detecting circuit, where the output signal controls at least one audio parameter.

19. The capacitive touch switch system of claim 18, where the single-pole high pass filter is optimized to filter 120 Hz signals.

* * * * *